United States Patent
Hanafusa

(10) Patent No.: US 9,952,924 B2
(45) Date of Patent: Apr. 24, 2018

(54) MEMORY DEVICE, SERVER DEVICE, AND MEMORY CONTROL METHOD

(71) Applicant: Kabushiki Kaisha Toshiba, Minato-ku, Tokyo (JP)

(72) Inventor: Yuichiro Hanafusa, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/916,767

(22) PCT Filed: Apr. 18, 2014

(86) PCT No.: PCT/JP2014/061093
§ 371 (c)(1),
(2) Date: Mar. 4, 2016

(87) PCT Pub. No.: WO2015/037267
PCT Pub. Date: Mar. 19, 2015

(65) Prior Publication Data
US 2016/0203046 A1    Jul. 14, 2016

(30) Foreign Application Priority Data
Sep. 10, 2013    (JP) .................................. 2013-187345

(51) Int. Cl.
*G06F 12/16*    (2006.01)
*G06F 11/10*    (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .. G06F 11/10; G06F 11/1008; G06F 11/1044; G06F 11/1068; G06F 3/064; G06F 3/0619; G06F 3/0653; G06F 3/0688
See application file for complete search history.

(56) References Cited

U.S. PATENT DOCUMENTS 4,799,221 A * 1/1989 Fukami .............. G11B 15/1875
                                                        360/53
6,185,134 B1    2/2001 Tanaka
(Continued)

FOREIGN PATENT DOCUMENTS

JP    2000-173289    6/2000
JP    2001-195205    7/2001
(Continued)

OTHER PUBLICATIONS

International Search Report dated Jul. 15, 2014 in corresponding PCT Application No. PCT/JP2014/061093, 6 pgs.
Office Action dated Feb. 24, 2015 in corresponding Japanese Application No. 2013-187345, 3 pgs.

*Primary Examiner* — Shelly A Chase
(74) *Attorney, Agent, or Firm* — Knobbe, Martens, Olson & Bear, LLP

(57) ABSTRACT

A memory device has a plurality of memory units, an error correction processor, and a memory controller. The memory units include semiconductor memories, and read and write in parallel. The error correction processor converts input content data into recording data which includes the content data and an error correction code. The error correction processor decodes the content data by performing conversion including error correction of recording data read out of the memory units. The memory controller writes recording data divided into a number of data into an area of areas extending over the memory units. The memory controller reads the divided recording data from the area. The memory controller determines that writing into the area has been completed normally if the number of the semiconductor
(Continued)

memories of which abnormality has been detected is less than or equal to a number of abnormalities correctable by the error correction processor.

9 Claims, 12 Drawing Sheets

(51) Int. Cl.
    *G06F 3/06*          (2006.01)
    *G11C 29/52*      (2006.01)

(52) U.S. Cl.
    CPC .......... *G06F 3/0653* (2013.01); *G06F 3/0688* (2013.01); *G06F 11/1008* (2013.01); *G06F 12/16* (2013.01); *G11C 29/52* (2013.01)

(56) References Cited

U.S. PATENT DOCUMENTS

| | | | |
|---|---|---|---|
| 7,178,088 B2* | 2/2007 | Hashimoto | G06F 11/1008 |
| | | | 714/764 |
| 9,250,996 B2* | 2/2016 | Kobori | H03M 13/1102 |
| 2011/0066883 A1 | 3/2011 | Dachiku | |
| 2012/0239853 A1* | 9/2012 | Moshayedi | G06F 11/1441 |
| | | | 711/103 |

FOREIGN PATENT DOCUMENTS

| | | |
|---|---|---|
| JP | 2001-222384 | 8/2001 |
| JP | 2008-204114 | 9/2008 |
| JP | 2011-060217 | 3/2011 |

\* cited by examiner

MEMORY DEVICE, SERVER DEVICE, AND MEMORY CONTROL METHOD

TECHNICAL FIELD

Embodiments of the present invention relate to a memory device, a server device, and a memory control method. This application is based upon and claims the benefit of priority from Japanese Patent Application No. 2013-187345, filed Sep. 10, 2013 the entire contents of which are incorporated herein by reference.

BACKGROUND ART

In recent years, a server device which is equipped with a semiconductor memory such as a flash memory is known. The server device performs parallel processing of a memory unit which has a plurality of semiconductor memories in order to improve throughput. For example, this kind of server device is suitably used as a server device which records and plays content data such as material data. However, there is a case that reliability of the conventional server device is not sufficient.

One application for consideration is JP2008-204114A.

SUMMARY OF INVENTION

Technical Problem

One aspect of the present invention provides a memory device, a server device, and a memory control method, which can improve reliability.

Solution to Problem

A memory device of embodiments has a plurality of memory units, an error correction processor, and a memory controller. Each of the memory units has semiconductor memories, and writes in parallel and reads in parallel. The error correction processor converts input content data into recording data which includes the content data and an error correction code. The error correction processor decodes the content data by performing conversion including error correction with, respect to the recording data read out of the memory units. The memory controller writes recording data, which has been divided into a predetermined number of data, into an area of areas extending over the memory units. The memory controller reads the divided recording data out of the area. The memory controller determines that writing into the area has been completed normally, at a time of writing the divided recording data into the area, if the number of the semiconductor memories of which abnormality has been detected is less than or equal to a predetermined number of which abnormality is correctable by the error correction processor.

DESCRIPTION OF EMBODIMENTS

Hereinafter, a server device and a memory device of embodiments will be described with reference to drawings.

First Embodiment

In the present embodiment, as an example of the server device, a video server which records content data such as video data and outputs the recorded content data will be described.

Figure 1:
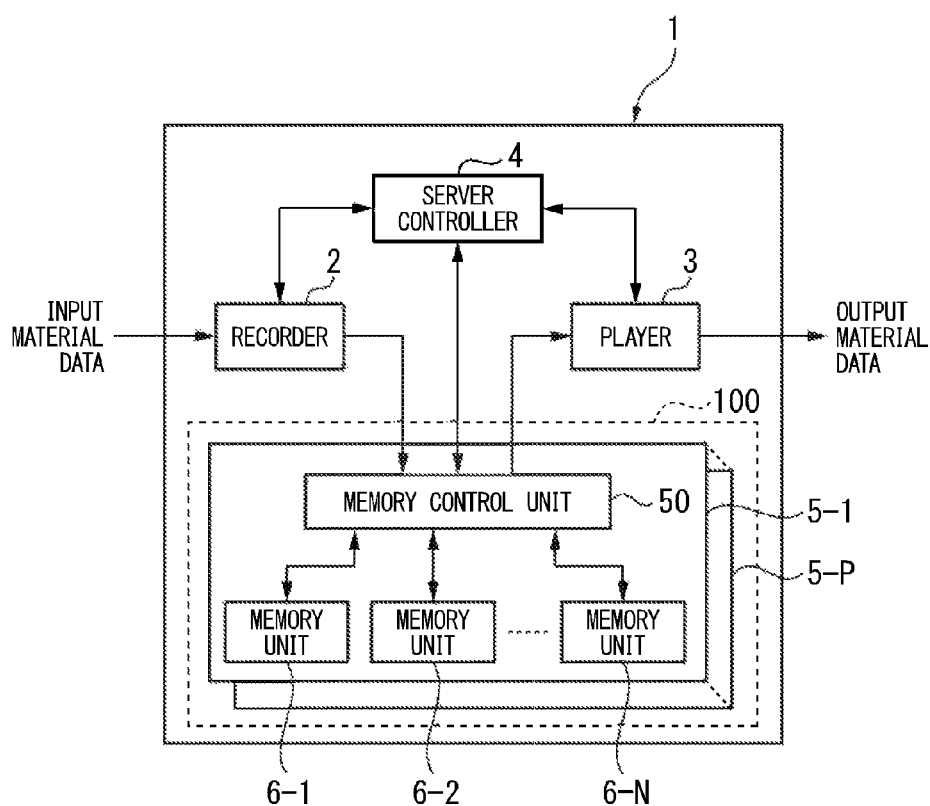
FIG. 1 is a block diagram illustrating an example of a video server 1 of the first embodiment.

FIG. 1 is a block diagram illustrating an example of a video server 1 of the first embodiment.

In the drawing, the video server 1 is equipped with a recorder 2, a player 3, a server controller 4, and a memory device 100. For example, the video server 1 records material data of program for broadcasting which are from a camera, a reproduction deck, a non-linear editor, or the like, and the video server 1 selectively plays (sends) material data, in accordance with broadcasting instructions. According to instructions based on a user's operation, the video server 1 performs a write control or a readout control of the material data.

For example, the recorder 2 obtains material data such as a video signal which is transmitted from a camera, a video deck, or the like, and the recorder 2 performs recording processing of encoding the obtained material data. Based on control of the server controller 4 which will be described later, the recorder 2 performs the recording processing, and the recorder 2 outputs the encoded material data to the memory device 100. Here, for example, the material data includes video data, voice data, and so on. In the embodiment, the recorder 2 is an example of an obtainer, and the material data is an example of content data.

The player 3 performs reproduction processing of decoding the material data read out of the memory device 100 and outputting the decoded material data (for example, a video signal). In this way, the player 3 outputs the material data read out of the memory device 100. In the embodiment, the player 3 is an example of an output portion.

For example, the server controller 4 is a processor such as a CPU (Central Processing Unit), and the server controller 4 totally controls the video server 1. For example, if material data is to be recorded, the server controller 4 instructs the recorder 2 to obtain the material data and to encode the obtained material data. The server controller 4 instructs the memory device 100 to write the material data. Thereby, the server controller 4 controls to store the material data obtained by the recorder 2 in the flash memory 61 included in the memory device 100, and the server controller 4 controls to read the material data stored in the flash memory 61 out of the memory device 100.

Moreover, for example, if the material data is to be played, the server controller 4 instructs the memory device 100 to read the material data, and the server controller 4 instructs the player 3 to decode the read material data which has been encoded and to output the decoded material data.

The memory device 100 is a storage device which records (stores) the material data based on control of the server controller 4. The memory device 100 is equipped with memory sets (5-1 to 5-P). The memory sets 5-1 to 5-P are the same configuration. In a case that an, arbitrary memory set included in the video server 1 or the memory device 100 is shown, or in a case that the memory sets are not clearly distinguished, it is described as a memory set 5.

The memory set 5 is equipped with a memory control unit 50 and memory units 6 (6-1, 6-2, ..., 6-N). The memory units 6-1 to 6-N are the same configuration. In a case that an arbitrary memory unit included in the video server 1 or the memory device 100 is shown, or in a case that the memory units are not clearly distinguished, it is described as a memory unit 6. In a case that the memory set 5 receives write instructions from the server controller 4, the memory set 5 writes (stores) the material data output from the recorder 2 into the memory units 6 in parallel based on control of the memory control unit 50. In a case that the memory set 5 receives readout instructions from the server controller 4, the memory set 5 reads the material data out of the memory units 6 in parallel based on control of the memory control unit 50, and the memory set 5 outputs the read material data to the player 3.

Figure 2:
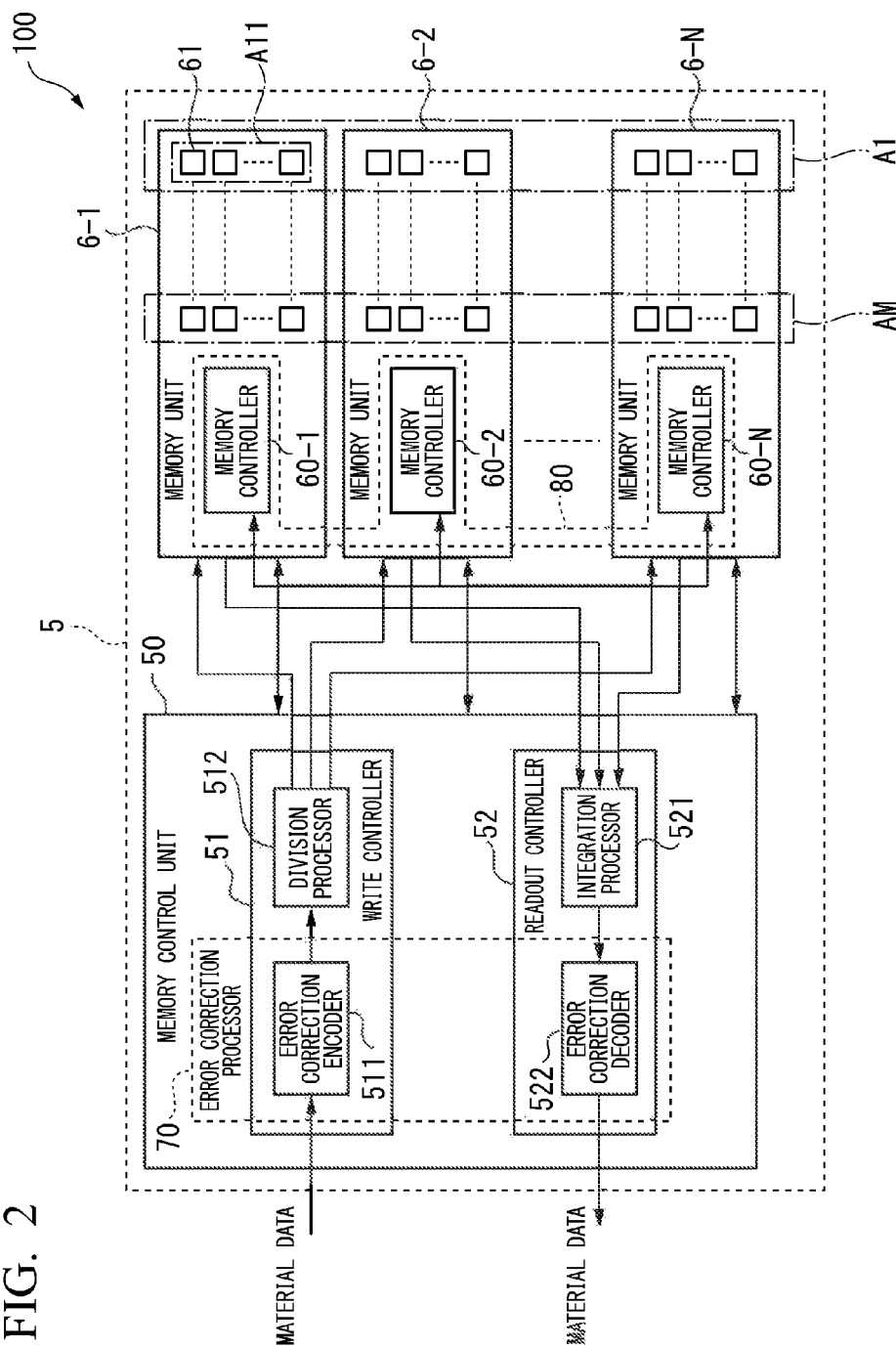
FIG. 2 is a block diagram illustrating an example of the memory device 100 of the present embodiment.

Here, with reference to FIG. 2, the configuration of the memory device 100 and the memory set 5 of the present embodiment is described in detail.

FIG. 2 is a block diagram illustrating an example of the memory device 100 of the present embodiment.

In this drawing, the memory device 100 is equipped with the memory set 5, and the memory set 5 is equipped with the memory control unit 50 and the memory units 6 (6-1, 6-2, ..., 6-N), as described above. Although the memory device 100 is equipped with two or more memory sets 5, the memory device 100 is simply shown as one memory set 5 in this drawing to describe the configuration of the memory set 5.

Each of the memory units 6 has flash memories 61, and each of the memory units 6 is capable of writing in parallel and reading in parallel. For example, the memory units 6 has areas (for example, the area A1 to the area AM) extending over the memory units and including a predetermined number of the flash memories 61, and each of the memory units 6 is capable of writing in parallel and reading in parallel in the each area. Here, the area, is a region in which writing and reading can be performed in, parallel with respect to data of predetermined size. The each area includes partial areas (for example, the partial area A11) in which writing and reading can be performed in parallel in the each memory units 6. The memory unit 6 writes in parallel data and reads data, in parallel, with respect to the flash, memories 61 in the partial area.

In addition, in the example shown in FIG. 2, the memory set 5 is equipped with memory units of N number (6-1 to 6-N) and areas of M number (the area A1 to the area AM). Detail configuration of the memory unit 6 will be described later.

For example, the memory control unit 50 is a processor such as a CPU, and the memory control unit 50 totally controls the memory set 5. The memory control unit 50 is equipped with a write controller 51 and a readout controller 52.

The write controller 51 converts the material data, which was input into the memory set 5, into recording data containing the material data and an error correction code, and the write controller 51 divides the recording data and outputs it to the memory units 6, in order to distribute it to the memory units 6 and perform write processing in parallel. The write controller 51 is equipped with an error correction encoder 511 and a division processor 512.

The error correction encoder 511 converts the input material data into the recording data of which error can be corrected. That is, the error correction encoder 511 converts the input material data into the recording data which includes the material data and the error correction code. For example, the error correction encoder 511 performs error correction encoding to the material data based on an error correction method by a Reed Solomon code.

Specifically, the error correction encoder 511 generates redundant data (error correction code) for the error correction by the Reed Solomon code based on the material data, and the error correction encoder 511 adds the generated redundant data to the material data, in order to perform the error correction encoding to the material data. Here, the above-described recording data is data in which the redundant data is added to the material data. The error correction encoder 511 generates the redundant data so that errors can be corrected with the error correction technique by the Reed Solomon code in a case that errors, which are less than or equal to a predetermined number (for example, a predetermined number of the flash memories 61), occur in the material data.

The division processor M2 divides the recording data, which was converted by the error correction encoder 511, into a predetermined number (for example, N) of divided data, and the division processor 512 outputs the divided recording data (divided data) to the memory unit 6. The division processor 512 divides the recording data in order to make the memory unit 6 perform processing in parallel, for example, in order to make the number of the divided data equal to the number of the memory units 6. The recording data output from the division processor 512 is stored (recorded) in the above-described area of the flash memories 61 in parallel by the each memory unit 6.

The readout controller 52 reads the divided recording data (divided data) out of the memory units 6 and unifies the data, and the readout controller 52 decodes (restores) the read recording data into the material data. The readout controller 52 outputs the decoded material data to the player 3. The readout controller 52 is equipped with an integration processor 521 and an error correction decoder 522.

The integration processor 521 reads, out of the memory units 6, the divided recording data (divided data) which is stored in the each partial area of the memory units 6, and the integration processor 521 obtains the data. The integration processor 521 integrates the divided data (for example, N divided, data) which is read out of the area, and the integration processor 521 outputs the integrated recording data to the error correction decoder 522.

Based on the redundant data for the error correction included in the recording data output from the integration processor 521, the error correction decoder 522 determines whether or not the data read out of the memory units 6 has an error (for example, garbled data caused by abnormalities at a time of writing or reading). The error correction decoder 522 removes the redundant data for the error correction from the read recording data, and the error correction decoder 522 decodes the material data, in a case that there is no error (garbled data) in the read data.

Moreover, the error correction decoder 522 further determines whether or not a number of errors is less than or equal to a correctable number, in a case that the read data has an error. In a case that, the number of errors is less than or equal to the correctable number, the error correction decoder 522 decodes the material data after performing the error correction processing. Thus, the error correction decoder 522 decodes the material data by performing conversion including error correction with respect to the recording data read out of the memory units 6, and the error correction decoder 522 outputs the decoded material data to the player 3.

Moreover, for example, the error correction decoder 522 performs error processing of notifying, to the server controller 4, error notification information which represents that normal material data cannot be read, in a case that the number of errors exceeds the correctable number.

In the present embodiment, the error correction encoder 511 and the error correction decoder 522, which were described above, correspond to the error correction processor 70. As described above, the error correction processor 70 converts the input material data into the recording data which includes the material data and the error correction code, and the error correction processor 70 decodes the material data by performing the conversion including the error correction with respect to the recording data read out of the memory units 6.

Next, the configuration of the memory unit 6 will be described.

In the present embodiment, the memory unit 6 is equipped with a memory controller 60 and flash memories 61. In FIG. 2, the memory controllers (60-1, 60-2, . . . , 60-N), which are included in the memory units (6-1, 6-2, . . . , 6-N) respectively, are the same configuration. In a case that an arbitrary memory controller included in the memory device 100 is shown, or in a case that the memory controllers are not clearly distinguished, it is described as a memory controller 60.

The flash memories 61 are nonvolatile memories which are electrically rewritable. For example, the flash memories 61 are NAND flash memories. Here, for example, the flash memories 61 are unit memories at a time of writing data in parallel or reading data in parallel. Moreover, the flash memories 61 included in the memory unit 6 have partial areas in which writing and reading can be performed in parallel. In the present embodiment, the flash memory 61 is an example of a semiconductor memory.

The memory controller 60 controls the writing and the reading of data with respect to the flash memories 61 included in the memory unit 6. For example, the memory controller 60 writes the recording data, which has been divided into a predetermined number of divided data (for example, N divided data), into any one of the areas (for example, the areas A1 to AM) extending over the memory units 6, and the memory controller 60 reads the divided recording data out of the area. For example, after writing divided data into the flash memories 61 corresponding to the area A1, if a next write processing is to be performed, the memory controller 60 writes divided data into any one of the areas (the area A1 to the area AM) in order to write divided data into an area (for example, the area A2) which is different from the area A1.

Moreover, the memory controller 60 writes into a divided area the divided data (divided recording data) output from the write controller 51, in accordance with a write request from the memory control unit 50. Here, the memory controller 60 determines that writing into the area is completed normally when the memory controller 60 writes the divided recording data into the area, if a number of the flash memories 61 of which abnormality has been detected is less than or equal to a predetermined number of which abnormality is correctable by the error correction processor 70. Here, the predetermined number of which abnormality is correctable is a number of the flash memories 61 corresponding to a number of which error can be corrected by the error correction processor 70. That is, even if the memory controller 60 failed to write the recording data, in a case that the number of the flash memories 61 which failed to write is less than or equal to the number of which error can be corrected by the error correction processor 70, the memory controller 60 determines that it is completed normally, and the processing is continued.

Specifically, when the memory controller 60 writes the divided data into the partial area of the area in the memory unit 6, the memory controller 60 detects a number of abnormalities representing a number of the flash memories 61 where abnormality has been detected in the partial area. For example, the memory controller 60 determines whether or not an abnormality occurs in writing based on status information which is output from the flash memories 61 with respect to the write command. The memory controller 60 calculates a total number of abnormalities in whole of one of the areas based on the detected number of abnormalities and the number of abnormalities which are in each of the partial areas and have been obtained by mutually communicating between the memory units 6. The memory controller 60 determines, based on the calculated total number of abnormalities, whether or not the number of the flash memories 61 of which abnormality has been detected is less than or equal to the predetermined number of which abnormality is correctable by the error correction processor 70.

Moreover, when the memory controller 60 writes the divided recording data into any one of the areas, if a number of times, in which abnormality of the flash memories 61 exceeding the predetermined number has been detected, reaches a predetermined threshold number, the memory controller 60 stops the write processing and notifies information representing an abnormal end to the memory control unit 50. Specifically, the memory controller 60 performs retry processing (re-performing processing) of writing, when the number of the flash memories 61 in which an abnormality has been detected exceeds the predetermined number of which abnormality is correctable by the error correction processor 70. If the write processing including the retry processing is failed for predetermined threshold number of times (for example, 3 times) continuously, the memory controller 60 stops the write processing and notifies information representing the abnormal end to the memory control unit 50.

Moreover, the memory controller 60 reads the divided data out of the partial area of the memory unit 6 in accordance with a readout request from the memory control unit 50, and the memory controller 60 outputs the data to the readout controller 52.

In addition, in the present embodiment, the memory controller 60 is an example of a partial memory controller. The memory controllers 60 (60-1 to 60-N) correspond to a memory controller 80.

Next, operation of the memory device 100 in the present embodiment is described with reference to drawings.

Figure 3:
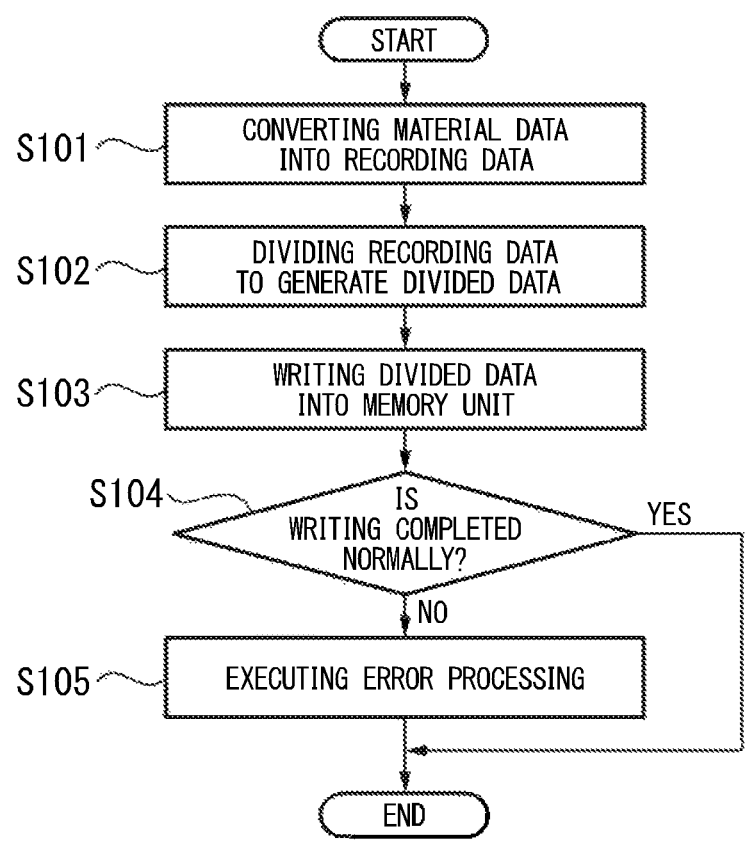
FIG. 3 is a flow chart illustrating an example of write processing of the memory device 100 in the present embodiment.

FIG. 3 is a flow chart illustrating an example of write processing of the memory device 100 in the present embodiment.

The memory device 100 starts the write processing shown in FIG. 3 based on write instructions of the material data from the server controller 4.

In FIG. 3, first, the memory device 100 converts material data into recording data (Step S101). That is, based on the write instructions of the material data from the server controller 4, the error correction encoder 511 of the memory control unit 50 obtains the material data from the recorder 2. The error correction encoder 511 generates the redundant data for the error correction by the Reed Solomon code based on the material data, and the error correction encoder 511 adds the generated redundant data to the material data, in order to generate the recording data to which the error correction encoding is performed.

Next, the division processor 512 of the memory control unit 50 divides the recording data to generate divided data (Step S102). That is, the division processor 512 divides the recording data, which was converted by the error correction encoder 511, into a predetermined number (for example, N) of divided data.

Next, the write controller 51 of the memory control unit 50 writes the divided data, into the memory units 6 (Step S103). Here, the division processor 512 outputs the divided recording data (divided data) to the memory units 6, and the each memory unit 6 performs write processing of the divided data. Here, the memory unit 6 writes the data into an area (for example, the area A1) of the areas (for example, the areas A1 to AM). The write processing by the memory unit 6 will be described later.

Next, the write controller 51 determines whether or not the writing has been completed normally (Step S104). That is, the write controller 51 determines whether or not the writing has been completed normally in accordance with a notice from the memory unit 6. In a case that the writing has been completed normally (Step S104: YES), the write controller 51 ends the processing. In a case that the writing has not been completed normally (abnormal end) (Step S104: NO), the write controller 51 advances the processing to Step S105.

In Step S105, the write controller 51 performs error processing. For example, the write controller 51 performs the error processing of notifying, to the server controller 4, error notification information representing that the writing of the material data is failed, and the write controller 51 ends the processing.

Next, processing of Step S103 shown in FIG. 3 is described with reference to FIG. 4.

Figure 4:
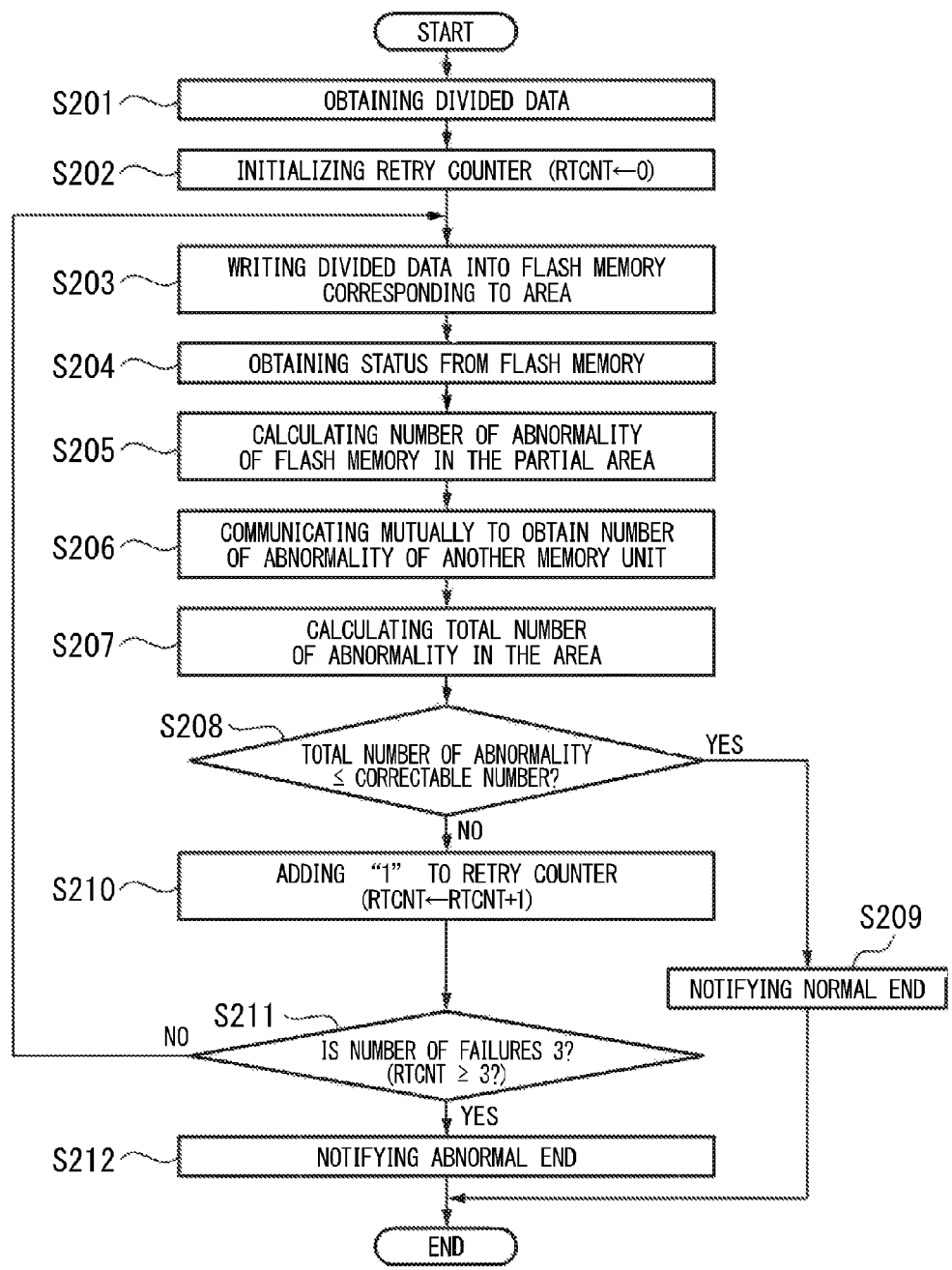
FIG. 4 is a flow chart illustrating an example of write processing of the memory unit 6 in the present embodiment.

FIG. 4 is a flow chart illustrating an example of write processing of the memory unit 6 in the present embodiment.

In this drawing, first, the memory unit 6 obtains divided data (Step S201). That is, the memory unit 6 obtains the divided data, which is output from the division processor 512, based on the write instructions from the write controller 51. For example, the memory unit 6 is equipped with a memory which is not shown and which stores the divided data temporarily. The obtained divided data is stored in the memory.

Next, the memory controller 60 of the memory unit 6 initializes a retry counter (Step S202). For example, the memory controller 60 sets the retry counter (not shown) to "0" (RTCNT←0).

Next, the memory controller 60 writes the divided data into the flash, memory 61 corresponding to the area (Step S203). Here, the memory controller 60 writes the divided data, which is obtained from the division processor 512, into the partial area which is included in the area and corresponds to the memory unit 6.

Next, the memory controller 60 obtains status from the flash memory 61 (Step S204). That is, the memory controller 60 obtains the status, which corresponds to a write command, from the each flash memory 61 corresponding to the partial area into which the divided data was written.

Next, the memory controller 60 calculates a number of abnormalities of the flash memories 61 in the partial area (Step S205). That is, for example, based on the status obtained from the each flash memory 61, the memory controller 60 calculates the number of abnormalities which represents that a number of the flash memories 61 of which abnormality has been detected in the partial area.

Next, the memory controller 60 obtains numbers of abnormalities of the other memory units 6 by mutually communicating between the memory units 6 (Step S206). That is, the memory controller 60 obtains numbers of abnormalities calculated by the memory controllers 60 which are included in the other memory units 6. The memory controller 60 outputs the number of abnormalities calculated by the self-controller to the other memory units 6.

Next, the memory controller 60 calculates a total number of abnormalities in the area (Step S207). That is, the memory controller 60 calculates the total number of abnormalities based on the number of abnormalities calculated by self-controller and the numbers of abnormalities obtained, from the other memory units 6.

Next, the memory controller 60 determines whether or not the number of abnormalities is less than or equal to a correctable number (predetermined number) (Step S208). In a case that the total number of abnormalities is less than or equal to the correctable number (Step S208: YES), the memory controller 60 advances processing to Step S209. In a case that the total number of abnormalities exceeds the correctable number (Step S208: NO), the memory controller 60 advances processing to Step S210.

In Step S209, the memory controller 60 notifies a normal end. That is, in a case that the total number of abnormalities is less than or equal, to the correctable number, the memory controller 60 determines that the writing into the area is completed normally, the memory controller 60 notifies, to the control part 51, that it is completed normally, and the processing is ended.

Also, in step S210, the memory controller 60 adds "1" to the retry counter (RTCNT←RTCNT+1).

Next, the memory controller 60 determines whether or not a number of failures reaches 3 (RTCNT≥3) (step S211). That is, the memory controller 60 determines whether a value of the retry counter reaches "3" or not. In a case that the number of failures reaches 3 (RTCNT≥3) (Step S211: YES), the memory controller 60 advances the process to step S212. In a case that the number of failures is less than 3 (RTCNT<3) (Step S211: NO), the memory controller 60 returns processing to Step S203 and performs retry processing.

In Step S212, the memory controller 60 stops the write processing, notifies information representing the abnormal end to the memory control unit 50, and ends the processing.

Thus, in, the present embodiment, even, if the memory device 100 detects an abnormality of writing at a time of the write processing, if it is within a range in, which abnormalities can be corrected by the error correction processor 70, the memory device 100 determines that the writing has been completed normally, and the memory device 100 continues the processing.

Figure 5:
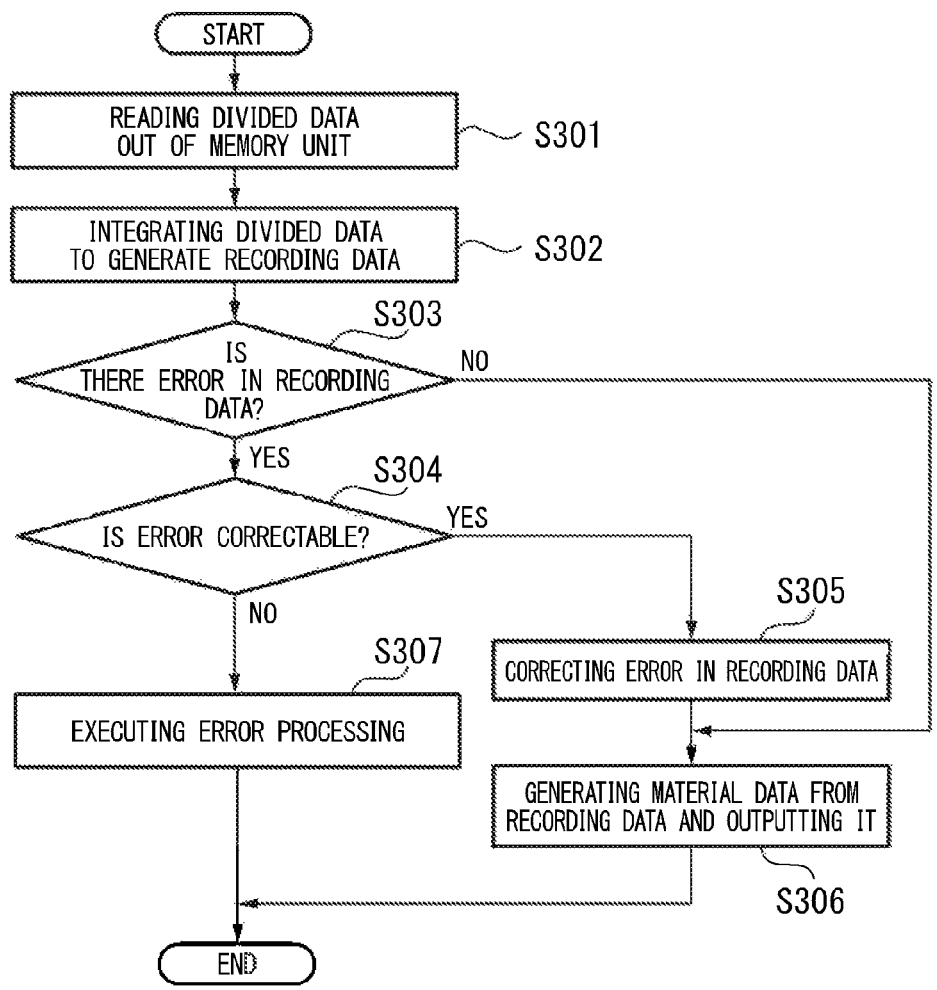
FIG. 5 is a flow chart illustrating an example of readout processing of the memory device 100 in the present embodiment.

Next, with reference to FIG. 5, an example of readout processing of the memory device 100 in the present embodiment is described.

FIG. 5 is a flow chart illustrating an example of readout processing of the memory device 100 in the present embodiment.

The memory device 100 starts the readout processing shown in FIG. 5 based on readout instructions of material data from the server controller 4.

In FIG. 5, first, the memory device 100 reads divided data out of the memory unit 6 (Step S301). That is, based on the readout instructions of the material data from the server controller 4, the readout controller 52 of the memory control unit 50 reads the divided data out of the each memory unit 6. Here, the memory controller 60 of the each memory unit 6 reads the divided data out of the partial area, and the memory controller 60 outputs it to the integration processor 521 of the readout controller 52.

Next, the integration processor 521 integrates the divided data to generate recording data (Step S302). That is, the integration processor 521 integrates the divided data read out of the each memory unit 6, and the integration processor 521 outputs the integrated recording data to the error correction decoder 522.

Next, the error correction decoder 522 determines whether or not there is at least one error in the integrated recording data (Step S303). That is, the error correction decoder 522 determines whether or not there is at least one error (for example, garbled data) in, the data read from the memory units 6 based on the redundant data for the error correction, included in the recording data output from the integration processor 521. In a case that there is at least one error in, the recording data (Step S303: YES), the error correction decoder 522 advances processing to Step S304. In a case that there is, no error in the recording data (Step S303: NO), the error correction decoder 522 advances the processing to Step S306.

Moreover, in Step S304, the error correction decoder 522 determines whether the error is correctable or not. That is, the error correction decoder 522 detects a number of errors included in the recording data, and the error correction decoder 522 determines whether or not the number of errors is less than or equal to the correctable number. In a case that the error is correctable (Step S304: YES), the error correction decoder 522 advances the processing to Step S305. In a case that the error is not correctable (Step S304: NO), the error correction decoder 522 advances the processing to Step S307.

In Step S305, the error correction decoder 522 performs the error correction with respect to the recording data.

Here, since it is the correctable error, the error correction decoder 522 corrects the recording data including at least one error by the error correction of the Reed Solomon code.

Moreover, in Step S306, the error correction decoder 522 generates the material data from the recording data, and the error correction decoder 522 outputs it to the player 3. For example, the error correction decoder 522 decodes the material data from the recording data except for the redundant data for the error correction. The error correction decoder 522 ends the processing after processing of Step S306.

On the other hand, in Step S307, the error correction decoder 522 executes error processing of readout. In this case, since the number of errors exceeds the correctable number, for example, the error correction decoder 522 executes the error processing of notifying, to the server controller 4, error notification information representing that normal material data cannot be read, and the error correction decoder 522 ends the processing.

As described above, the memory device 100 of the present embodiment has the plurality of memory units 6, the error correction processor 70, and the memory controller 80. Each of the memory units 6 has flash memories 61, and each of the memory units 6 is capable of writing in parallel and reading in parallel. The error correction processor 70 converts input material data into recording data which includes the material data and an error correction code, and the error correction processor 70 decodes the material data by performing conversion including error correction with respect to the recording data read out of the memory units 6. The memory controller 80 writes divided recording data, which has been divided into a predetermined number of divided data, into an area of areas extending over the memory units 6, and the memory controller 80 reads the divided recording data out of the area. Moreover, the memory controller 80 determines that the writing into the area has been completed normally at a time of writing the divided recording data, into the area, if the number of the flash memories 61 of which abnormality has been detected is less than or equal to a predetermined number of which abnormality is correctable by the error correction processor 70.

Thereby, even if the memory device 100 of the present embodiment detects an abnormality at a time of the write processing, if it is within a range in which the abnormality can be corrected by the error correction processor 70, the memory device 100 determines that the writing has been completed normally, and the memory device 100 continues the processing. Therefore, for example, at a time of writing, the memory device 100 of the present embodiment can reduce the frequency where an abnormality is detected and the processing is stopped. That is, for example, the memory device 100 of the present embodiment can reduce an occurrence frequency that the state where write processing cannot be performed normally continues until the memory unit 6 is exchanged.

Moreover, at a time of the write processing, if it is within a range in, which the abnormality can be corrected by the error correction processor 70, even if the abnormality is detected, since the memory device 100 of the present embodiment can operate without stopping processing, reliability in the write processing can be improved.

Moreover, in the present embodiment, the memory controller 80 includes a memory controller 60 that is included in each of the memory units 6, and the memory controller 60 corresponds to each of the memory units 6. The memory controller 60 detects a number of abnormalities representing a number of the flash memories 61 where abnormality has been detected in a partial area which is of the area and corresponds to one of the memory units 6, when the memory controller 60 writes the divided data into the partial area. The memory controller 60 calculates a total number of abnormalities in one area based on the detected number of abnormalities and the numbers of abnormalities which are in each of the partial areas and have been obtained by mutually communicating between the memory units 6. The memory controller 60 determines, based on the calculated total number of abnormalities, whether or not the number of the flash memories 61 of which abnormality has been detected is less than or equal to the predetermined number of which abnormality is correctable by the error correction processor 70.

Thereby, the memory device 100 of the present embodiment can complete, within the memory unit 6, the processing for improving the reliability in the above-described write processing, and the memory device 100 can realize it. Therefore, the memory device 100 of the present embodiment can improve the reliability in the write processing by a simple means for changing processing of the memory unit 6. In addition, the memory device 100 of the present embodiment can use the conventional configuration as it is for the configuration other than the memory unit 6.

Moreover, according to the present embodiment, the video server 1 has the above-described memory device 100, the recorder 2, the server controller 4, and the player 3. The recorder 2 obtains material data. The server controller 4 writes the material data obtained by the recorder 2 into flash memories 61 included in the memory device 100, and the server controller 4 reads, out of the memory device, the material data written into the flash memories 61. The player outputs the material data read out of the memory device.

Thereby, for example, at a time of writing, like the memory device 100, the video server 1 of the present embodiment can reduce the frequency where an abnormality is detected and the processing is stopped. Therefore, the video server 1 of the present embodiment can improve the reliability in the write processing.

Moreover, a memory control method of the memory device 100 of the present embodiment includes a step of converting, by the error correction processor 70, input material data into recording data which includes the material data and the redundant data (error correction code). The memory control method, of the memory device 100 of the present embodiment includes a step of writing, by the memory controller 80, divided recording data, which has been divided into a predetermined number of divided data, into an area of areas extending over the memory units 6, and determining that writing into the area has been completed normally, at a time of writing the divided recording data into the area, if a number of the flash memories 61 of which abnormality has been detected is less than or equal to a predetermined number of which abnormality is correctable by the error correction processor 70. The memory control method includes a step of reading, by the memory controller 80, the divided recording data out of the area. The memory control method includes a step of decoding, by the error correction processor 70, the material data by performing conversion including error correction with respect to the recording data read out of the memory units 6.

Thereby, for example, at a time of writing, like the memory device 100 and the video server 1, the memory control method of the present embodiment can reduce the frequency where an abnormality is detected and the processing is stopped. Therefore, the memory control method of the present embodiment can improve the reliability in the write processing.

Next, a second embodiment will be described with reference to drawings.

Second Embodiment

Although an example in which the memory unit 6 calculates the total number of abnormalities in whole of one area has been described in the above-described first embodiment, an example in which the memory control unit 50 calculates the total, number of abnormalities in whole of one area will be described in the present embodiment.

Figure 6:
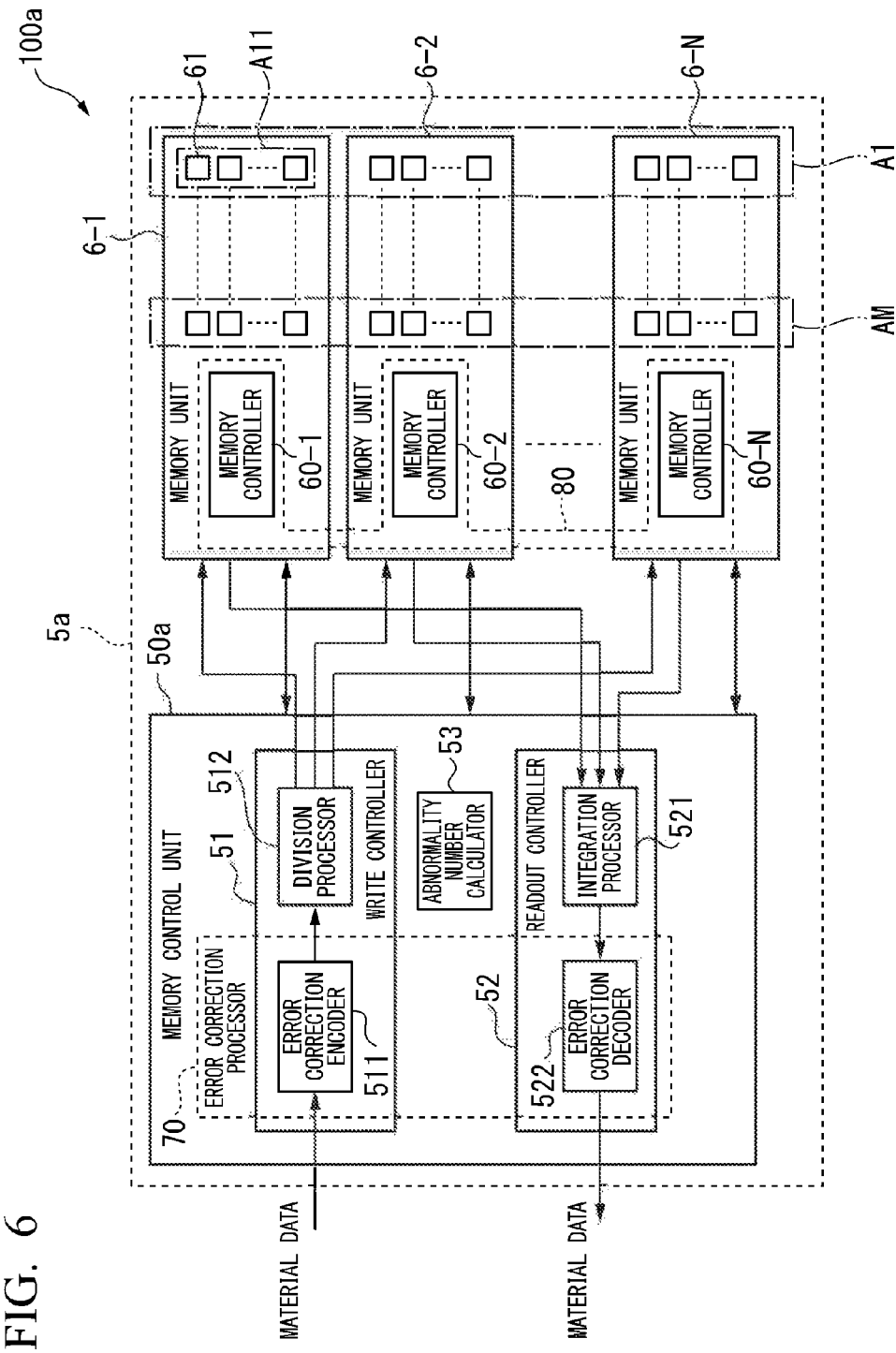
FIG. 6 is a block diagram illustrating an example of the memory device 100a in the present embodiment.

FIG. 6 is a block diagram illustrating an example of the memory device 100a in the present embodiment.

In FIG. 6, the memory device 100a is equipped with a memory set 5a, and the memory set 5a is equipped with a memory control unit 50a and memory units 6 (6-1, 6-2, . . . , 6-N). Although the memory device 100a is equipped with two or more memory sets 5, the memory device 100a is simply shown as one memory set 5a in this drawing to describe the configuration of the memory set 5a.

In the present embodiment, it is the same as the memory device 100 of the first embodiment shown in FIG. 1 except for performing processing in which the memory control unit 50a calculates the above-described total number of abnormalities.

In this drawing, configurations that correspond to those in FIG. 2 are assigned the same reference numerals, and the descriptions thereof will be omitted.

For example, the memory control unit 50a is a processor such as a CPU, and the memory control unit 50a totally controls the memory set 5a. The memory control unit 50a is equipped with a write controller 51, a readout controller 52, and an abnormality number calculator 53. Like the first embodiment, also in the present, embodiment, the error correction encoder 511 and the error correction, decoder 522 correspond to the error correction processor 70.

The abnormality number calculator 53 obtains, from the memory units 6, a number of abnormalities representing a number of the flash memories 61 where abnormality has been detected in a partial area, when each of the memory units 6 writes the divided data into the partial area. The abnormality number calculator 53 calculates a total number of abnormalities in whole of one area based on the obtained number of abnormalities. The abnormality number calculator 53 outputs the calculated total number of abnormalities to each of the memory units 6. The abnormality number calculator 53 of the present embodiment is an example of a calculator.

In addition, the memory controller 60 of the memory unit 6 in the present embodiment detects a number of abnormalities representing a number of the flash memories 61 where abnormality has been detected in the partial area, when the memory controller 60 writes the divided data into the partial area. The memory controller 60 outputs the detected number of abnormalities to the abnormality number calculator 53. The memory controller 60 determines, based on the total number of abnormalities calculated by the abnormality number calculator 53, whether or not the number of the flash memories 61 of which abnormality has been detected is less than or equal to the predetermined number.

Thus, in, the present embodiment, the abnormality number calculator 53 of the memory control unit 50a calculates the total number of abnormalities in one area instead of the memory controller 60.

Next, operation of the memory device 100a in the present embodiment is described with reference to drawings.

Figure 7:
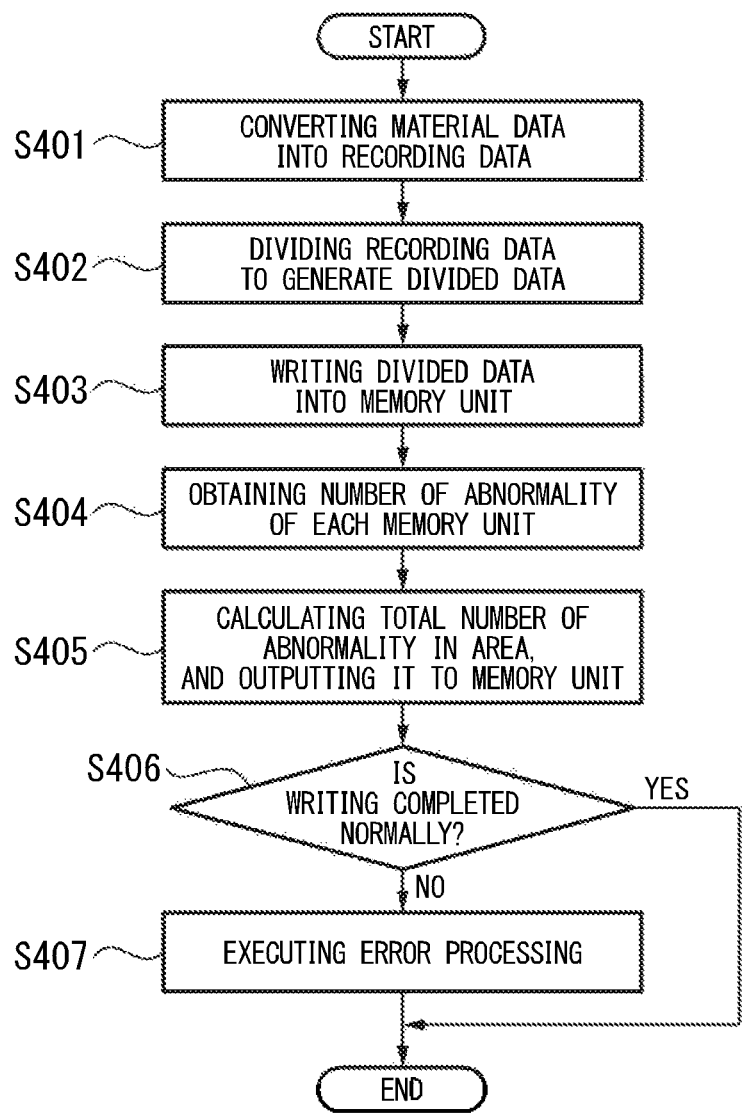
FIG. 7 is a flow chart illustrating an example of write processing of the memory device 100a in the present embodiment.

FIG. 7 is a flow chart illustrating an example of write processing of the memory device 100a in the present embodiment.

The memory device 100a starts the write processing shown in FIG. 7 based on write instructions of the material data from the server controller 4.

In FIG. 7, since the processing from Step S401 to Step S403 is the same as the processing from Step S101 to Step S103 shown in FIG. 3, the description thereof is omitted here. In the present embodiment, the point that the memory controller 60 does not calculate the total number of abnormalities in the processing of Step S403 is different from the processing of Step S103, and details thereof will be described later with reference to FIG. 8.

In following Step S404, the abnormality number calculator 53 of the memory control unit 50a obtains the number of abnormalities of each memory unit 6. That is, the abnormality number calculator 53 obtains, from each memory unit 6, the number of abnormalities calculated by the each memory unit 6.

Next, the abnormality number calculator 53 calculates the total number of abnormalities, in one area, and the abnormality number calculator 53 outputs it to the each memory unit 6 (Step S405). That is, the abnormality number calculator 53 calculates the total number of abnormalities in one area based on the number of abnormalities in the partial area obtained from the each memory unit 6. The abnormality number calculator 53 outputs the calculated total number of abnormalities to the each memory unit 6.

Since the processing of following Step S406 and Step S407 is the same as the processing of Step S104 and Step S104 shown in FIG. 3, the descriptions thereof are omitted here.

Next, the processing of Step S403 shown in FIG. 7 is described with reference to FIG. 8.

Figure 8:
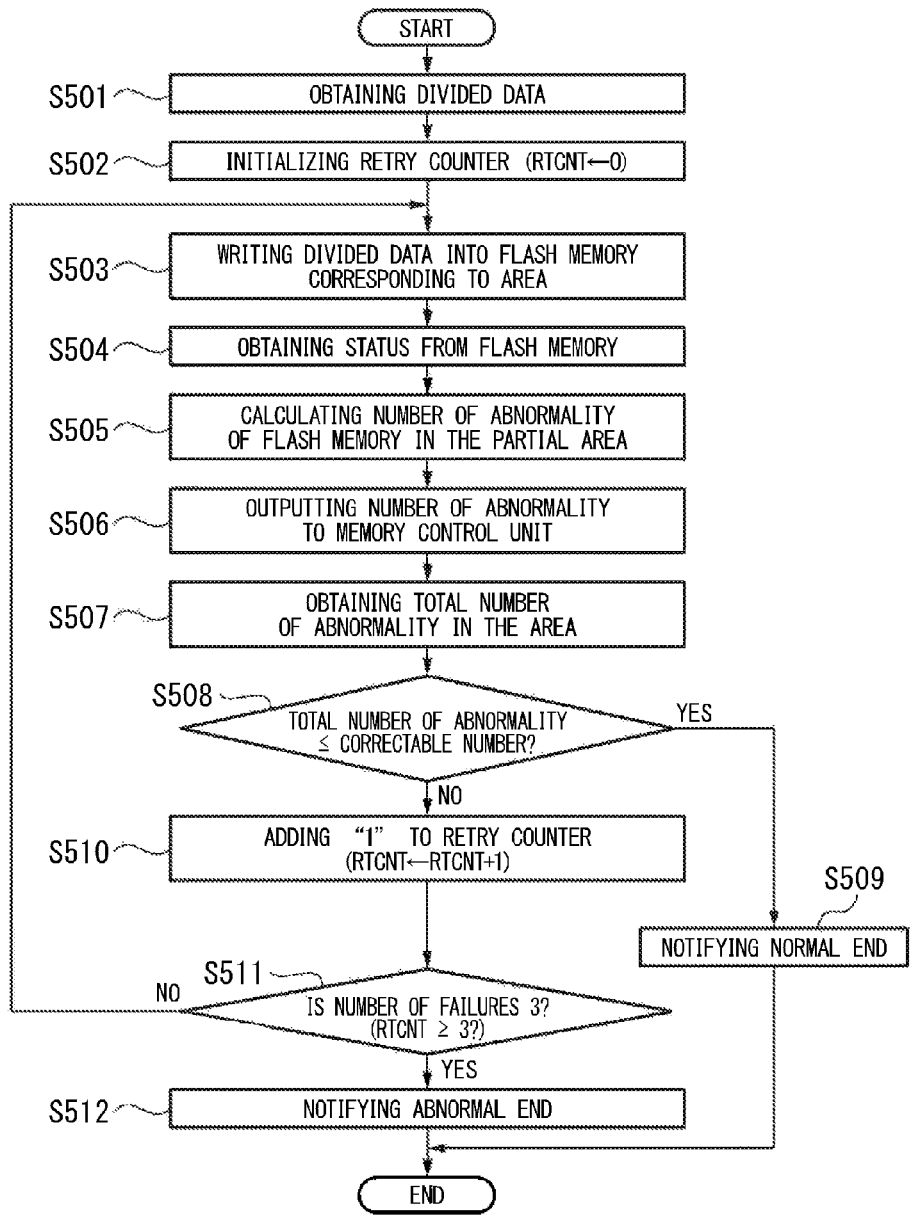
FIG. 8 is a flow chart illustrating an example of write processing of the memory unit 6 in the present embodiment.

FIG. 8 is a flow chart illustrating an example of write processing of the memory unit 6 in the present embodiment.

In this drawing, since the processing from Step S501 to Step S505 and the processing from Step S508 to Step S512 are the same as the processing from Step S201 to Step S205 and the processing from Step S208 to Step S212 which are shown in FIG. 4, the descriptions thereof are omitted here.

In Step S506, the memory controller 60 outputs the number of abnormalities to the memory control unit 50a. That is, the memory controller 60 outputs the calculated number of abnormalities in, the partial area to the abnormality number calculator 53 of the memory control unit 50a.

The processing of Step S506 is performed by the memory controller 60 included in each of the memory units 6.

Next, the memory controller 60 obtains the total number of abnormalities in the area (Step S507). That is, the memory controller 60 obtains, from the abnormality number calculator 53, the total number of abnormalities calculated by the abnormality number calculator 53 of the memory control unit 50a.

Thus, in, the present embodiment, the abnormality number calculator 53 of the memory control unit 50a calculates the total number of abnormalities in one area. The memory controller 60 determines, based on the total number of abnormalities obtained from the abnormality number calculator 53, whether or not the total number of abnormalities is less than or equal to the correctable number (predetermined number).

Moreover, since the readout processing of the memory device 100a in the present embodiment is the same as the readout processing in the first embodiment shown in FIG. 5, the descriptions thereof are omitted.

As described above, the memory device 100a of the present embodiment has the abnormality number calculator 53. The memory controller 80 includes a memory controller 60 included in each of the memory units 6, and the memory controller 60 corresponds to each of the memory units 6. The memory controller 60 detects a number of abnormalities representing a number of the flash memories 61 where abnormality has been detected in a partial area which is of the area and corresponds to one of the memory units 6, when the memory controller 60 writes the divided data into the partial area. The memory controller 60 outputs the detected number of abnormalities to the abnormality number calculator 53. The abnormality number calculator 53 obtains, from the memory units 6, the number of abnormalities representing the number of the flash memories 61 where abnormality has been detected in the partial area which is of the area and corresponding to each of the memory units 6, when writing the divided data into the partial area. The abnormality number calculator 53 calculates a total number of abnormalities in one area based on the obtained number of abnormalities. The memory controller 60 determines, based on the total number of abnormalities calculated by the abnormality number calculator 53, whether or not the number of the flash memories 61 of which abnormality has been detected is less than or equal to the predetermined number. Like the first embodiment, the memory controller 60 determines that writing into the area has been completed normally, if a number of the flash memories 61 of which abnormality has been detected is less than or equal to a predetermined number of which abnormality is correctable by the error correction processor 70.

Thereby, like the first embodiment, if it is within a range in which the abnormality can be corrected by the error correction processor 70, even if an abnormality is detected, since the memory device 100a of the present embodiment can operate without stopping processing, reliability in the write processing can be improved.

Moreover, since a part of the processing of the memory unit 6 is processed by the abnormality number calculator 53, processing load of the memory unit 6 can be reduced in the memory device 100a of the present embodiment.

Next, a third embodiment will be described with reference to drawings.

Third Embodiment

In the present embodiment, an example of prohibiting from using an area as error processing when writing into the area, in a case that the number of the flash memories 61 in which an abnormality has been detected exceeds the correctable predetermined number, will be described.

Figure 9:
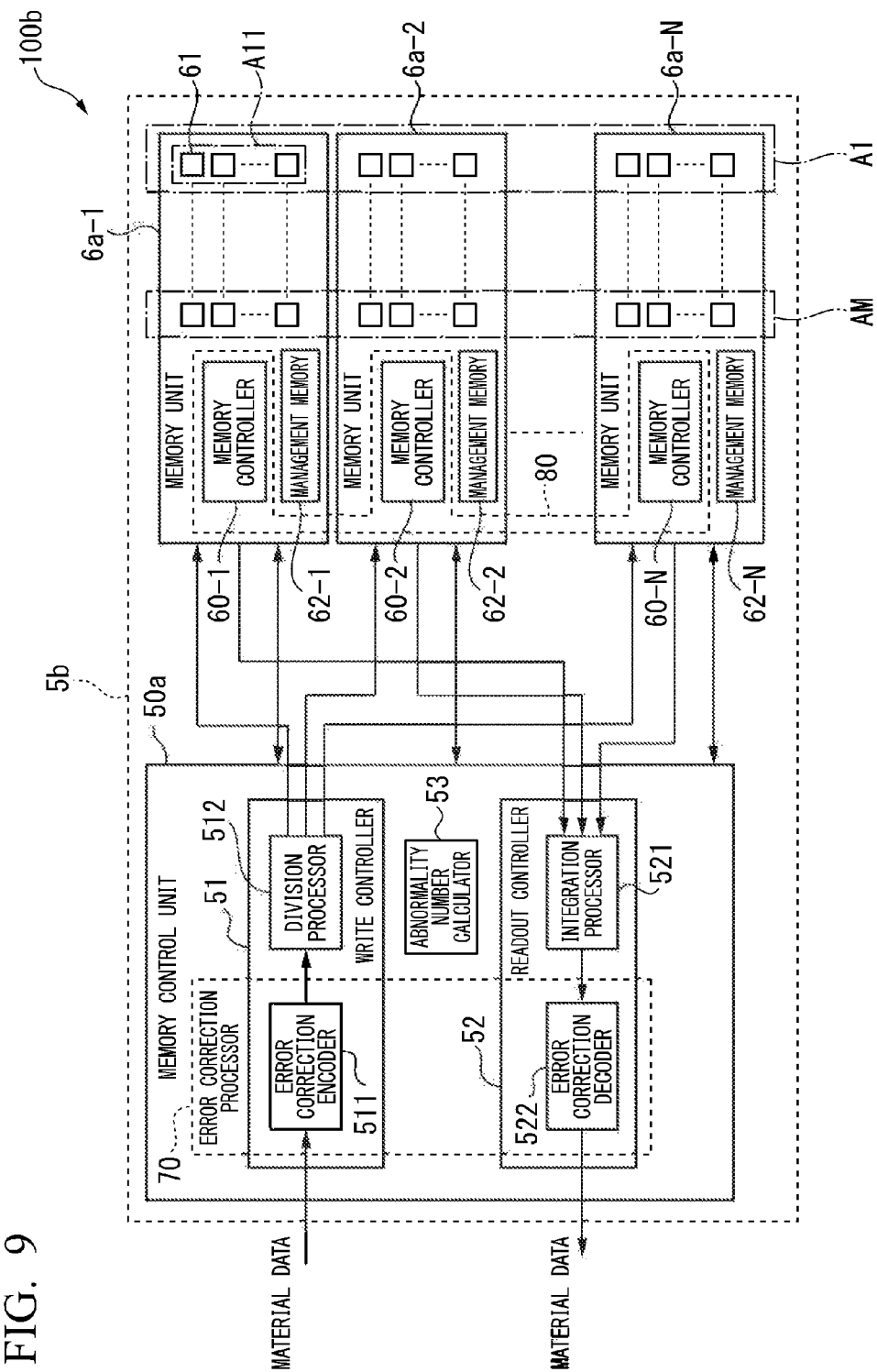
FIG. 9 is a block diagram illustrating an example of the memory device 100b in the present embodiment.

FIG. 9 is a block diagram illustrating an example of the memory device 100b in the present embodiment.

In FIG. 9, the memory device 100b is equipped, with a memory set 5b, and the memory set 5b is equipped with a memory control unit 50a and memory units 6a (6a-1, 6a-2, . . . , 6a-N). Although the memory device 100b is equipped with two or more memory sets 5b, the memory device 100b is simply shown as one memory set 5b in this drawing to describe the configuration of the memory set 5b. The memory units 6a-1 to 6a-N are the same configuration. In a case that an arbitrary memory unit included in the memory device 100a is shown, or in a case that the memory units are not clearly distinguished, it is described as a memory unit 6a.

In the present embodiment, the memory unit 6a is equipped with a memory controller 60, flash memories 61, and a management memory 62. The present embodiment is different from the first and second embodiments with regard to having the management memory 62. The management memories 62-1 to 62-N are the same configuration. In a case that an arbitrary management memory included in the memory device 100a is shown, or in a case that the management memories are not clearly distinguished, it is described as a management memory 62.

In addition, in this drawing, configurations that correspond to those in FIG. 6 are assigned the same reference numerals, and the descriptions thereof will be omitted.

The management memory 62 stores information, representing whether or not each of the area A1 to area AM is prohibited from using.

For example, the management memory 62 associates identification information for identifying the each area with prohibition setting information representing whether or not the area is prohibited from using, and the management memory 62 stores it. For example, in a case that the area A1 is prohibited from using, information (for example, "1") representing use-prohibition and corresponding to the area A1 is stored in the management memory 62 as the prohibition setting information. For example, in a case that the area A1 is not prohibited from using (it can be used), information (for example, "0") representing use-permission and corresponding to the area A1 is stored in the management memory 62 as the prohibition setting information.

In addition, an initial state of the prohibition setting information corresponding to the each area of the management memory 62 is the information (for example, "0") representing the use-permission. In a case that the use-prohibition with respect to the each area is determined by the memory controller 60, the information (for example, "1") representing the use-prohibition is stored as the prohibition setting information.

At a time of writing the divided recording data into any one of the areas, if a number of times, in which, abnormality of flash memories 61 has been detected more than the predetermined number, reaches a predetermined threshold number (for example, 3), the memory controller 60 of the present embodiment prohibits from using the area including the flash memories 61 of which abnormality has been detected. For example, if the number of times, in which the number of the detected abnormality of the flash memories 61 exceeds the predetermined number, reaches 3 (first threshold number) continuously, the memory controller 60 prohibits from using the area including the flash memories 61 of which abnormality has been detected.

Specifically, at a time of the write processing, in a case that the detected number of abnormalities exceeds the predetermined number, the memory controller 60 performs the retry processing of the write processing. In, a case that the retry processing continues 2 times and the number of abnormalities exceeds the predetermined number (in a case that failure of the write processing continues 3 times from the first write processing), the area including the flash memories 61 of which abnormality has been detected is prohibited from using. In this case, for example, the memory controller 60 changes into "1" the prohibition setting information corresponding to the area of the management memory 62.

Next, operation of the memory device 100b in the present embodiment is described with reference to drawings.

Since the write processing of the memory device 100b in the present embodiment is the same as that of the second embodiment shown in FIG. 7, descriptions thereof are omitted here. In the present embodiment, since a part of the processing of Step S403 shown in FIG. 7 differs from the second embodiment, the processing of Step S403 of FIG. 7 will be described below, with reference to FIG. 10.

Figure 10:
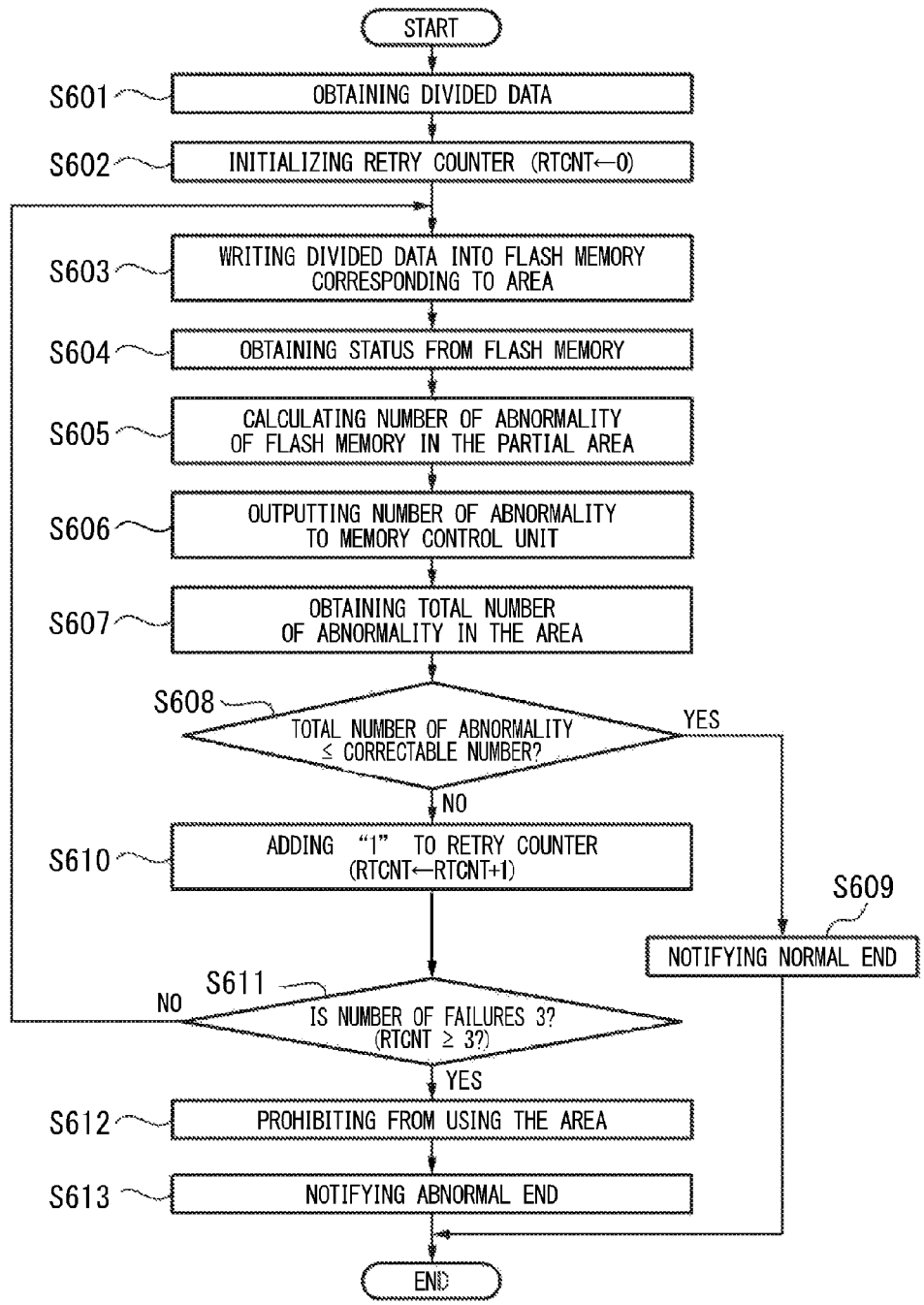
FIG. 10 is a flow chart illustrating an example of write processing of the memory unit 6a in the present embodiment.

FIG. 10 is a flow chart illustrating an example of write processing of the memory unit 6a in the present embodiment.

In this drawing, since the processing from Step S601 to Step S611 is the same as the processing from Step S501 to Step S511 shown in FIG. 8, the descriptions thereof are omitted here. In the present embodiment, processing of Step S612 is added.

In Step S612, the memory controller 60 prohibits from using the area to which the write processing is performed, as processing in a case that the number of times, in which the number of abnormalities exceeds the predetermined number, is greater than or equal to 3 times. That is, for example, the memory controller 60 changes into "1" the prohibition setting information corresponding to the area of the management memory 62. Thereby, the memory controller 60 controls not to use the area of which prohibition setting information is "1", in subsequent processing.

Since the following processing of Step S613 is the same as the processing of Step S512 shown in FIG. 8, descriptions thereof are omitted.

Thus, in, the present embodiment, if the number of times, in which the number of the detected abnormality of the flash memories 61 exceeds the predetermined, number, reaches 3 (a first threshold number) continuously, the memory controller 80 (memory controller 60) prohibits from using the area including the flash memories 61 of which abnormality has been detected.

Moreover, since the readout processing of the memory device 100b in the present embodiment is the same as the readout processing in the first embodiment shown in FIG. 5, descriptions thereof are omitted.

As described above, at a time of writing the divided recording data into any one of the areas, if a number of times, in which abnormality of flash memories 61 has been detected more than the predetermined number, reaches a predetermined threshold number (for example, 3), the memory controller 80 (memory controller 60) of the present embodiment prohibits from using the area of which number of detected abnormalities reaches the predetermined threshold number.

Thereby, since the memory device 100b of the present embodiment does not use the area in subsequent processing, for example, it can be prevented from using the area in which write error has occurred every time, and also prevented from continuing a state in which the write processing of data cannot be executed normally until the memory unit 6a is exchanged.

Moreover, in the present embodiment, if the number of times, in which the number of the detected abnormality of the flash memories 61 exceeds the predetermined number, reaches a first threshold number (for example, 3) continuously, the memory controller 80 prohibits from using the area. That is, if the number of times, in which the number of the detected abnormality exceeds the correctable predetermined number, reaches a first threshold number continuously by the retry processing, the memory controller 80 prohibits from using the area including the flash memories 61 of which abnormality has been detected.

Thus, at a time of the write processing, in order to prohibit from using the area in a case that the number of detected abnormalities reaches the first threshold number continuously, the memory device 10b is capable of prohibiting from using the area unless the write processing is failed by an accidental factors such as a noise. That is, the memory device 100b of the present embodiment can improve a robustness of write processing.

In addition, if the number of times, in which the number of the detected abnormality of the flash memories 61 exceeds the correctable predetermined number, reaches a second threshold number as a cumulative number in a predetermined period, the memory controller 80 may prohibit from using the area. Here, for example, the predetermined period is such as a period of write processing, a period during the video server 1 operates from power-on, a period from when a system of the video server 1 is reset, and so on. The condition for use-prohibition may be used in combination with the case that abnormality of the flash memories 61 reaches the first threshold number continuously by the retry processing. Furthermore, in this case, the second threshold number may be equal to the first threshold number, and the second threshold number may be different from the first threshold number.

For example, at a time of write processing, in a case that the memory controller 80 detects abnormality more than or equal to 5 times as a cumulative number from power-on with respect to an area, or in a case that the memory controller 80 detects abnormality more than or equal to 3 times continuously by retry with respect to the area, the memory controller 80 prohibits from using the area.

Thereby, for example, the memory device 100*b* can further reduce an occurrence frequency that the state where write processing cannot, be performed normally continues until the memory unit 6 is exchanged.

Next, a fourth embodiment will be described with reference to drawings.

Fourth Embodiment

In the third embodiment described above, an example in which when writing into an area, in a case that a number of the flash memories 61 in which abnormality has been detected exceeds the correctable predetermined number, the area is prohibited from using, is described, but the condition for prohibiting the area are not limited thereto. In the present embodiment, an example in which without being limited to the correctable predetermined number, in a case that at least one abnormality of the flash memories 61 is detected, the area including the flash memory 61 of which abnormality has been detected is prohibited from using, will be described.

Figure 11:
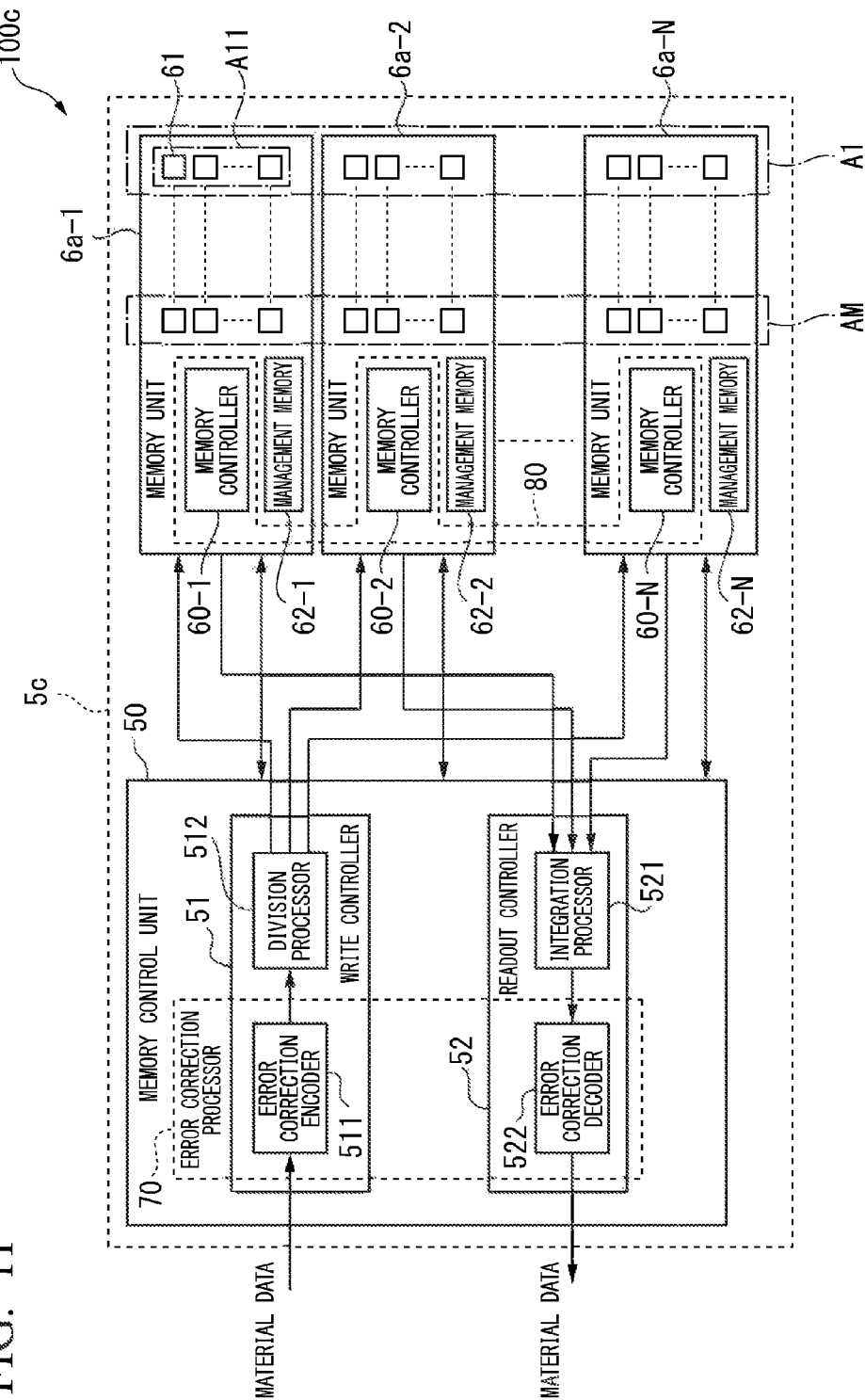
FIG. 11 is a block diagram illustrating an example of the memory device 100c in the present embodiment.

FIG. 11 is a block diagram illustrating an example of the memory device 100*c* in the present embodiment.

In FIG. 11, the memory device 100*c* is equipped with a memory set 5*c*, and the memory set 5*c* is equipped with a memory control unit 50 and memory units 6*a* (6*a*-1, 6*a*-2, . . . , 6*a*-N). Although the memory device 100*c* is equipped with two or more memory sets 5*c*, the memory device 100*c* is simply shown as one memory set 5*c* in, this drawing to describe the configuration of the memory set 5*c*.

In addition, in this drawing, configurations that correspond to those in FIG. 2 and FIG. 9 are assigned the same reference numerals, and the descriptions thereof will be omitted.

At a time of writing the divided recording data into an area, if a number of times, in which abnormality of any one of flash memories 61 included in the area has been detected, reaches a predetermined threshold number (for example, 3), the memory controller 60 of the present embodiment prohibits from using the area including the flash memories 61 of which abnormality has been detected.

Next, operation of the memory device 100*c* in the present embodiment is described with reference to drawings.

Since the write processing of the memory device 100*c* in the present embodiment is the same as that of the first embodiment shown in FIG. 3, descriptions thereof are omitted here. In the present embodiment, since a part of the processing of Step S103 shown in FIG. 3 differs from the first and third embodiments, the processing of Step S103 of FIG. 3 will be described below, with reference to FIG. 12.

Figure 12:
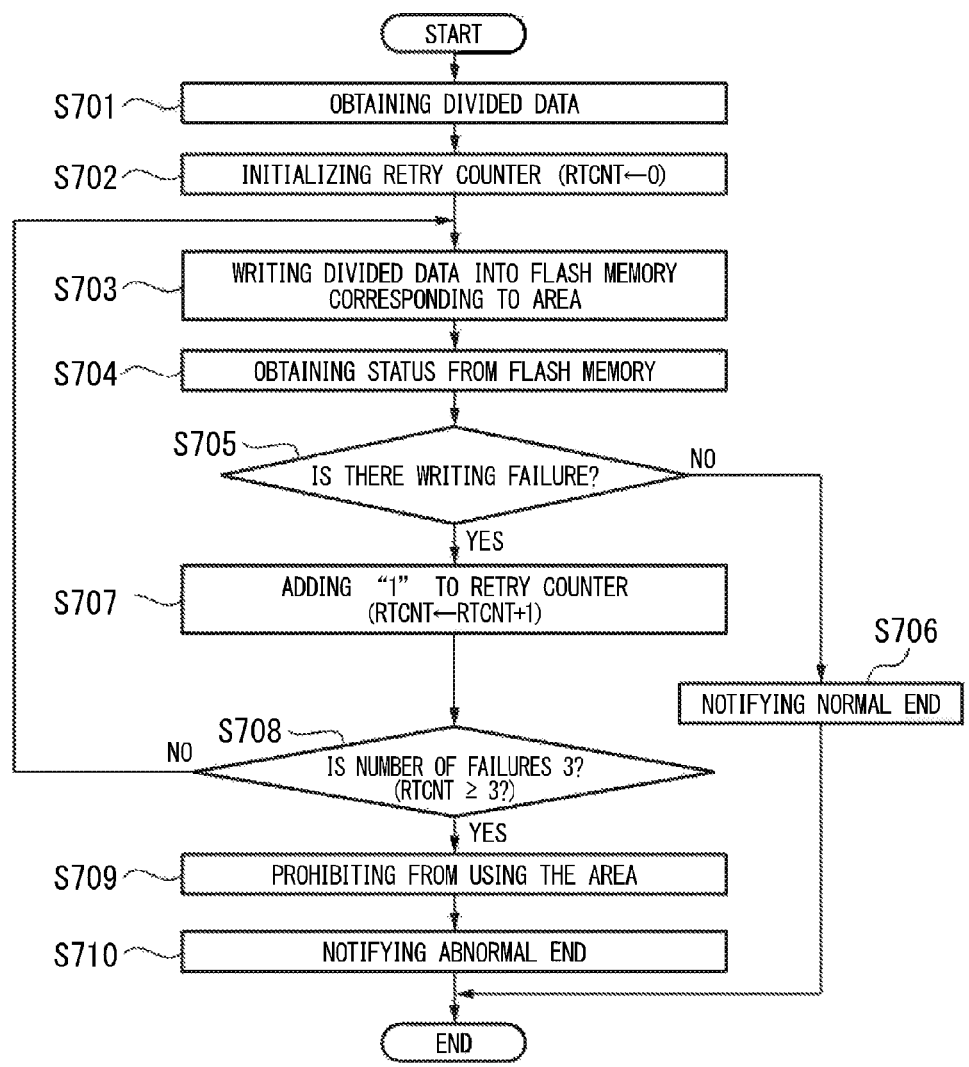
FIG. 12 is a flow chart illustrating an example of write processing of the memory unit 6a in the present embodiment.

FIG. 12 is a flow chart illustrating an example of write processing of the memory unit 6*a* in the present embodiment.

The present embodiment is different from the third embodiment with regard to a point that the processing of Step 605 and Step 606 is not executed.

That is, in this drawing, since the processing from Step S701 to Step S704 is the same as the processing from Step S601 to Step S604 shown in FIG. 10, the descriptions thereof are omitted here.

In Step S705, the memory controller 60 determines whether there is writing failure or not. By mutually communicating between the memory units 6*a*, in a whole of one area, based on status information output from the flash memory 61, the memory controller 60 determines whether or not abnormality of the flash memory 61 is detected. In a case that there is a writing failure (Step S705: YES), the memory controller 60 advances the processing to Step S707. In a case that there is not the writing failure (Step S705: NO), the memory controller 60 advances the processing to Step S706.

Since the following processing from Step S706 to Step S710 is the same as the processing from Step S609 to Step S613 shown in FIG. 10, the description thereof is omitted here.

Thus, if a number of times, in which abnormality of flash memories 61 has been detected, reaches 3 continuously (a predetermined threshold number), the memory controller 60 prohibits from using the area of which number of detected abnormalities reaches the predetermined threshold number.

Moreover, since the readout processing of the memory device 100*c* in the present embodiment is the same as the readout processing in the first embodiment shown in FIG. 5, descriptions thereof are omitted.

As described above, the memory device 100*c* (memory set 5*c*) of the present embodiment is equipped with the memory units 6*a* and the memory controller 80 (memory controller 60). Each of the memory units 6*a* has the flash memories 61, and each of the memory units 6*a* is capable of writing in parallel and reading in parallel. The memory controller 80 writes the recording data based on the material data, which has been divided into a predetermined number of divided data, into an area of areas extending over the memory units 6*a*, and the memory controller 80 reads the divided recording data out of the area. The memory controller 80 prohibits from using the area of which number of detected abnormalities has been reached the predetermined threshold number, at a time of writing the divided recording data into the area, if a number of times, in which abnormality of flash memories 61 has been detected, reaches a predetermined threshold number (for example, 3).

Thereby, since the memory device 100*c* of the present embodiment does not use the area in subsequent processing after prohibiting from using the area, for example, it can be prevented from using the area in which write error has occurred every time, and also prevented from continuing a state in which, the write processing of data cannot be executed normally until the memory unit 6*a* is exchanged.

In addition, the memory device 100 (100*a*, 100*b*, 100*c*) may be equipped with a part of or all of the memory controllers 60 outside the memory unit 6 (6*a*). In this case, the memory controllers 60 included in the memory units 6 (6*a*) may be integrated into one memory controller 80 in the memory device 100 (100*a*, 100*b*, 100*c*).

Moreover, the memory control unit 50 (50a) may be equipped with the memory controller 80, or the memory control unit 50 (50a) may be equipped with a part of or all of the memory controllers 60.

Moreover, in the above-described third and fourth embodiments, although the memory unit 6a is equipped with the management memory 62, the management memory 62 may be disposed outside the memory unit 6 (6a), or the management memory 62 may be disposed in the memory control unit 50 (50a).

Moreover, in each of the above-described embodiments, although the server device is the video server 1 as an example, it may be another server device.

Moreover, in each of the above-described embodiments, although the memory device 100 (100a, 100b, 100c) stores data into the flash memory 61 as an example, it may be another rewritable semiconductor memory (for example, EEPROM, RAM, FeRAM (Ferroelectric Random Access Memory), or the like).

Moreover, in each of the above-described embodiments, although the error correction, processor 70 uses the error correction technique by the Reed Solomon code as an example, it is not limited thereto. For example, a cyclic code, a Hamming code, a BCH (Bose-Chaudhuri-Hocquenghem) code, or the like may be used as an error correction code, and other error correction codes may be also used.

Moreover, in each of the above-described embodiments, although the recorder 2 includes the function of coding the material data such as an obtained picture signal, it may obtain coded material data. Moreover, although the player 3 includes the function of decoding the material data (for example, video data) read out of the memory device 100 (100a, 100b, 100c), it may output coded material data.

In addition, the program, for realizing the function of each configuration included in the video server 1 or the memory device 100 (100a, 100b, 100c) of the embodiments may be stored in a computer readable storage medium, and the program stored in the storage medium may be loaded and executed on a computer system, so as to perform the processing of the each configuration included in the video server 1 or the memory device 100 (100a, 100b, 100c). Here, "the program stored in the storage medium may be loaded and executed on a computer system" includes installing the program into the computer system. Here, "computer system" includes hardware resources such as an OS and peripheral devices.

Moreover, "computer system" may also include a plurality of computer devices connected to a network including a communication line such as the Internet, WAN, LAN, and a dedicated line. Moreover, "computer readable storage medium" may be a portable medium such as a flexible disk, a magneto optical disk, a ROM, or a CD-ROM, or a storage device such as a hard disk built in a computer system. Thus, the storage medium storing the program may be non-transitory storage medium such as a CD-ROM.

Moreover, in order to distribute the program, a storage medium disposed inside or outside which can be accessed, from a distribution server is also included in the storage medium. The program may be divided into a plurality of programs, and each configuration included in the video server 1 or the memory device 100 (100a, 100b, 100c) may integrate the programs after downloading them at different timings respectively. The distribution servers for distributing the divided programs, respectively may be different from each other. Furthermore, "computer readable storage device" includes a device which holds a program for a definite period of time, like a volatile memory (RAM) which is inside a computer system used as a server or a client when a program is transmitted through a network. Moreover, the program may realize a part of the above-described functions. Furthermore, the program may be a file for realizing the functions in cooperation with a program which has been recorded in the computer system, so-called a differential file (differential program).

Moreover, a part of or all of the functions may be implemented as an integrated circuit such as an LSI (Large Scale Integration). The functions may be individually implemented as a processor, or a part of or all of the functions may be integrated into a processor. The integration into a circuit is not limited to LSI and may be implemented by using a dedicated circuit or a general purpose processor. In a case that a new technique for integration into a circuit, which will replace LSI, emerges with the advancement of semiconductor technology, an integrated circuit based on such a technique may be used.

According to at least one of the above-described embodiments, reliability can be improved by having the memory control units 50 and 50a which determine that writing into the area has been completed normally at a time of writing the divided content data into the area, if a number of the flash memories 61 of which abnormality has been detected is less than or equal to a correctable predetermined number, or having the memory control units 50 and 50a which prohibit from using the area of which number of times, in which abnormality has been detected, reaches the predetermined number, if a number of times, in which, abnormality of flash memories 61 has been detected, reaches a predetermined threshold number.

While certain embodiments have been described these embodiments have been presented by way of example only, and are not, intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and, spirit of the inventions.

The invention claimed is:

1. A memory device comprising:
a plurality of memory units each of which has semiconductor memories and writing in parallel and reading in parallel;
an error correction processor that converts input content data into recording data which includes the content data and an error correction code and outputs the recording data to the memory units, the error correction processor decoding the content data by performing conversion including error correction with respect to the recording data read out of the memory units; and
a memory controller that writes recording data, which has been divided into a predetermined number of data, into an area of areas extending over the memory units, the memory controller reading the divided recording data out of the area, the memory controller determining that writing into the area has been completed normally, at a time of writing the divided recording data into the area, if the number of the semiconductor memories of which abnormality has been detected is less than or equal to a predetermined number of which abnormality is correctable by the error correction processor.

2. The memory device according to claim 1,
wherein at a time of writing the divided recording data into any one of the areas, if a number of times, in which abnormality of the semiconductor memories has been detected more than the predetermined number, reaches a predetermined threshold number, the memory controller prohibits from using the area of which number of times, in which abnormality has been detected, reaches the predetermined number.

3. The memory device according to claim 2,
wherein if the number of times, in which the number of the detected abnormality of the semiconductor memories exceeds the predetermined number, reaches a first threshold number continuously, the memory controller prohibits from using the area.

4. The memory device according to claim 2,
wherein if the number of times, in which the number of the detected abnormality of the semiconductor memories exceeds the predetermined number, reaches a second threshold number as a cumulative number in a predetermined period, the memory controller prohibits from using the area.

5. The memory device according to claim 1,
wherein the memory controller comprises a partial memory controller that is included in each of the memory units, the partial memory controller corresponding to each of the memory units,
wherein the partial memory controller detects a number of abnormalities representing a number of the semiconductor memories where abnormality has been detected in a partial area which is of the area and corresponds to one of the memory units, when the partial memory controller writes the divided recording data into the partial area,
wherein the partial memory controller calculates a total number of abnormalities in the area based on the detected number of abnormalities and the numbers of abnormalities which are in each of the partial areas and have been obtained by mutually communicating between the memory units, and
wherein the partial memory controller determines, based on the calculated total number of abnormalities, whether or not the number of the semiconductor memories of which abnormality has been detected is less than or equal to the predetermined number of which abnormality is correctable by the error correction processor.

6. The memory device according to claim 1, further comprising:
a calculator that obtains a number of abnormalities representing a number of the semiconductor memories where abnormality has been detected in a partial area which is of the area and corresponds to one of the memory units, the calculator calculating a total number of abnormalities in the area based on the obtained number of abnormalities, when writing the divided recording data into the partial area,
wherein the memory controller comprises a partial memory controller that is included in each of the memory units, the partial memory controller corresponding to each of the memory units, and
wherein the partial memory controller detects a number of abnormalities representing a number of the semiconductor memories where abnormality has been detected in the partial area, when the partial memory controller writes the divided recording data into the partial area,
wherein the partial memory controller outputs the detected number of abnormalities to the calculator, and
wherein the partial memory controller determines, based on the total number of abnormalities calculated by the calculator, whether or not the number of the semiconductor memories of which abnormality has been detected is less than or equal to the predetermined number.

7. A memory device comprising:
a plurality of memory units each of which has semiconductor memories and writing in parallel and reading in parallel; and
a memory controller that writes recording data, which is based on content data divided into a predetermined number of data, into an area of areas extending over the memory units, the memory controller reading the divided recording data out of the area, the memory controller prohibiting the area in which an abnormality has been detected a threshold number of times from being used, at a time of writing the divided recording data into the area, if a number of times, in which abnormality of the semiconductor memories has been detected, reaches the threshold number.

8. A server device comprising:
a memory device according to claim 1;
an obtainer that obtains content data;
a server controller that writes the content data obtained by the obtainer into a semiconductor memory included in the memory device, the server controller reading, out of the memory device, the content data written into the semiconductor memory; and
an output portion that outputs the content data read out of the memory device.

9. A memory control method of a memory device which comprises a plurality of memory units each of which has semiconductor memories and writing in parallel and reading in parallel, comprising:
converting, by an error correction processor, input content data into recording data which includes the content data and an error correction code;
writing, by a memory controller, divided recording data, which has been divided into a predetermined number of data, into an area of areas extending over the memory units, and determining that writing into the area has been completed normally, at a time of writing the divided recording data into the area, if the number of the semiconductor memories of which abnormality has been detected is less than or equal to a predetermined number of which abnormality is correctable by the error correction processor;
reading, by the memory controller, the divided recording data out of the area; and
decoding, by the error correction processor, the content data by performing conversion including error correction with respect to the recording data read out of the memory units.

* * * * *